United States Patent
Baskette et al.

[11] Patent Number: 6,021,053
[45] Date of Patent: Feb. 1, 2000

[54] METHOD AND APPARATUS FOR SWITCHING CIRCUIT SYSTEM INCLUDING A SATURABLE CORE DEVICE WITH MULTIPLE ADVANTAGES

[75] Inventors: Robert W. Baskette, Chagrin Falls; Gregory A. Bass, Austintown, both of Ohio

[73] Assignee: Ajax Magnethermic Corporation, Warren, Ohio

[21] Appl. No.: 09/121,879

[22] Filed: Jul. 24, 1998

[51] Int. Cl.$^7$ .............................. H02M 1/12; H02H 7/10
[52] U.S. Cl. .................. 363/40; 363/55; 363/97
[58] Field of Search .................. 363/39, 40, 50, 363/55, 56, 24, 25, 16, 17, 97, 98, 131, 132

[56] References Cited

U.S. PATENT DOCUMENTS

| | | |
|---|---|---|
| 3,329,908 | 7/1967 | Harms . |
| 5,394,319 | 2/1995 | Attwood ................................. 363/20 |
| 5,479,337 | 12/1995 | Voigt ...................................... 363/131 |
| 5,536,980 | 7/1996 | Kawate et al. .......................... 307/116 |
| 5,559,656 | 9/1996 | Chokhawala ............................ 361/18 |
| 5,635,799 | 6/1997 | Hesterman .............................. 315/127 |
| 5,815,386 | 9/1998 | Gordon .................................... 363/50 |
| 5,912,810 | 6/1999 | Jacobs et al. ............................ 363/20 |

FOREIGN PATENT DOCUMENTS 60-121961  6/1985  Japan .

Primary Examiner—Y. J. Han
Attorney, Agent, or Firm—Fay, Sharpe, Fagan, Minnich & McKee, LLP

[57] ABSTRACT

An energy-efficient power inverter is disclosed which changes direct current provided at a pair of source terminals to alternating current at load terminals. The power inverter comprises a switch device and snubber circuit including a resistance, a capacitance and a saturable core device for selectively removing the resistance from the snubber circuit. At saturation the core device effectively shorts the resistance out of the circuit, and upon coming out of saturation the device effectively reinserts the resistance for improved reduction in power losses during the switch operation.

38 Claims, 9 Drawing Sheets

HALF BRIDGE INVERTER WITH SERIES LOAD CIRCUIT

FULL BRIDGE INVERTER WITH SERIES LOAD CIRCUIT

FULL BRIDGE INVERTER WITH SERIES PARALLEL LOAD CIRCUIT

METHOD AND APPARATUS FOR SWITCHING CIRCUIT SYSTEM INCLUDING A SATURABLE CORE DEVICE WITH MULTIPLE ADVANTAGES

BACKGROUND OF THE INVENTION

This invention pertains to the art of inverters or switching circuits and has specific application to high-current switching circuits using power transistors.

The invention is particularly applicable to switching circuits that use insulated gate bipolar transistors (IGBTs) and zero-voltage-switching (ZVS) capacitors and will be described with particular reference thereto. However, it will be appreciated that the invention has broader applications such as a safety circuit for protecting against open circuit voltage spikes, or snubber networks for high current devices to eliminate switching losses and protect electrical devices, circuitry or components from the voltage spikes. The invention thus may be advantageously employed in other environments and applications.

In industrial electronics and other applications, inverters or switching circuits are often used to convert direct current (DC) to alternating current (AC). Switching circuits are capable of supplying high current at high voltage at specific AC frequencies for applications such as induction heating.

One type of solid-state switching circuit contains power transistors that makes use of current gains greater than unity. Examples of such power transistors are insulated gate bipolar transistors (IGBTs) and metal-oxide-semiconductor-field-effect transistors (MOSFETs). When the power transistors are switched off, the turn-off times are usually intended to be very fast, and even when minimized, the stray inductance of the switching circuit can result in unacceptable voltage spikes in excess of the normal rating of the device, can potentially harm components in the circuit, and contribute to switching losses. As switching circuits must deal with higher and higher frequencies in high power industrial environments, this problem becomes more and more serious.

To control the voltage spikes and to reduce switching losses, ZVS capacitors are used in conjunction with the power transistors. In one example, a ZVS capacitor is wired in parallel to an IGBT. In addition, a clamping diode is typically wired in parallel to the ZVS capacitor and IGBT. However, a major problem with such a ZVS capacitor configuration is that the capacitor creates a resonant circuit with the bus inductance. Accordingly, when the IGBTs are switched and cause voltage spikes, severe oscillations (ringings) are set up in the circuit which can damage or cause malfunctions in the IGBTs. The RMS current requirements for the capacitor can be more than doubled.

Snubber circuits for damping circuit ringing comprise merely placing a resistor in series with the ZVS capacitor. FIG. 6 shows such a circuit. In this regard, a resistor may be placed in series with the capacitor, but at typical switching currents and speeds, the resistor will have to dissipate significant power.

The present invention contemplates a new and improved method and apparatus which simply and economically overcomes all of the above-referenced problems and others and provides a substantial improvement in efficiency in the handling of the switching.

SUMMARY OF THE INVENTION

In accordance with the present invention, a method is provided for switching a high frequency inverter circuit for obtaining significant reduction in power dissipation while limiting voltage spikes and damping ringing oscillations. The switch of the inverter circuit is disposed in parallel with a network consisting of a saturable core transforming device, a resistor and a capacitor. If the switch is conducting a current, an opening of the switch will tend to generate a voltage spike as a result of circuit inductance resisting the interruption of the current. The parallel network provides a path for the interrupted current to reduce the undesired voltage spike. The saturable core transforming device is sized to quickly saturate upon the opening of the circuit to effectively disconnect the resistor from the parallel path and thereby limit power dissipation that would normally occur in the resistor. As the capacitor charges up, the current is reduced through the saturable core transforming device, thereby unsaturating the saturable core so that the resistor is effectively reinserted as a power dissipating load in the network. The resistor thus operates to damp the ringing that would normally occur in the circuit. The method of the system thus reduces power dissipation in the resistor by effectively connecting the resistor only during the period of time of each switching cycle when the saturable core transforming device is unsaturated.

In accordance with another aspect of the present invention, the saturable core device comprises a transformer having a preselected primary to secondary turns ratio. The capacitor is disposed on the primary and the resistor is disposed on the secondary. The reflected inductance of the secondary circuit to the primary is reduced in accordance with the turns ratio.

In accordance with another aspect of the present invention, the saturating comprises effectively converting the transformer to a relatively low inductance short of the resistor.

In accordance with yet another aspect of the present invention, the capacitor is sized to accommodate an anticipated energy spike by the stray inductance of the switching circuit and a fast interruption of the switching current. The resistor is sized to dampen a ringing of the circuit.

In accordance with an embodiment of the apparatus of the present invention, a power inverter changes direct current provided at a pair of source terminals to alternating current at load terminals. A first transistor has a base, a collector and an emitter. The collector and the emitter conduct current from the one of the source terminals to one of the output terminals. A first transformer has a magnetic core, a primary winding and a secondary winding. A first end of the primary winding is connected to either the collector or the emitter. A first source of capacitance is connected between a second end of the primary winding and the other of the collector and the emitter. A first resistor dampens oscillations occurring in the circuit when the first transistor is switched. The resistor is connected between a first and a second end of the secondary winding of the first transformer.

In accordance with a more limited aspect of the present invention, a second transistor has a base, a collector and an emitter. The collector and the emitter conduct current from the other of the source terminals to the one of the output terminals. A second transformer has a magnetic core, a primary winding and a secondary winding. A first end of the primary winding is connected to one of the collector and the emitter of the second transistor. A second source of capacitance is connected between a second end of the primary winding of the second transformer and the other of the collector and the emitter of the second transistor. A second resistor dampens oscillations occurring in the circuit when one or more of the first and second transistors is switched. The resistor is connected between a first and a second end of the secondary winding of the second transformer.

In accordance with another more limited aspect of the present invention, the number of turns of the secondary winding is greater than the number turns of the primary winding.

One advantage of the present invention is its action as a snubber circuit that effectively disconnects the damping resistor at times when the capacitor current is the greatest, thereby limiting the power dissipated in the resistor.

Another advantage of the present invention is a snubber circuit which introduces minimal inductance to the circuit. The transformer secondary is connected to the damping resistor so that the value of the resistance reflected back to the primary is a fraction of the value that would occur if the resistor were placed directly in series with the capacitor. The impedance on the secondary is reflected to the primary as its value divided by the square of the turn's ratio. So while the value of the resistance can be adjusted for the desired reflected value in the primary, the inductance in the secondary is divided by the square of the turn's ratio and reflected to the primary as a much smaller value.

Still further advantages of the present invention will become apparent to those of ordinary skill in the art upon a reading and understanding the following detailed description of the preferred embodiments.

BRIEF DESCRIPTION OF THE DRAWINGS

The invention may take form in various components and arrangements of components and in various steps and arrangement of steps. The drawings are only for purposes of illustrating preferred embodiments and are not to be construed as limiting the invention.

DETAILED DESCRIPTION OF THE PREFERRED EMBODIMENTS

Figure 1:
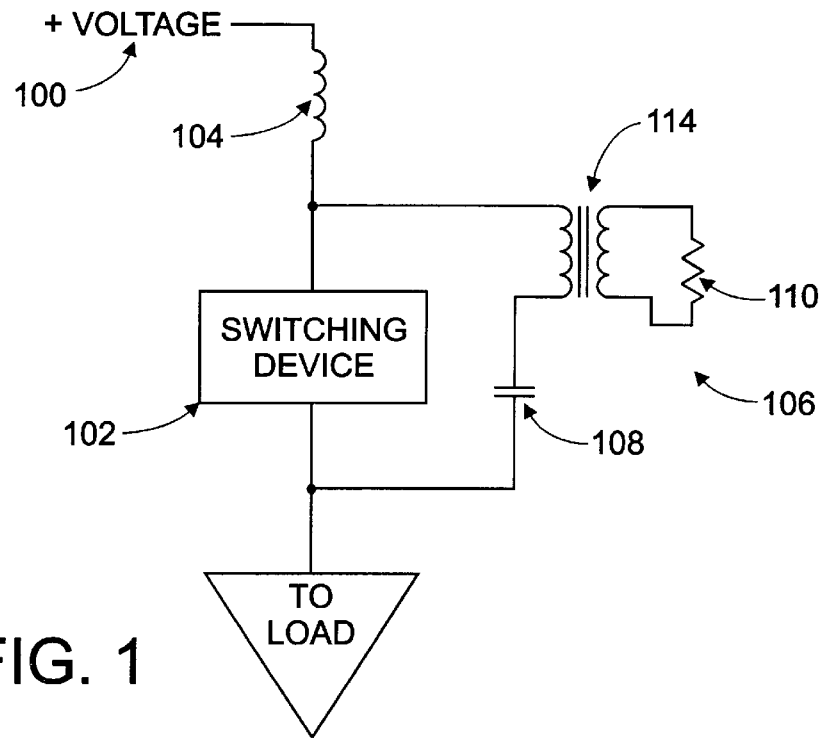
FIG. 1 is a general schematic diagram of a ZVS circuit formed in accordance with the present invention.

With particular reference to FIG. 1, an improved method and system for inserting a damping resistor in a switching circuit is shown. Keeping in mind that a preferred embodiment of the subject invention is for converting a high voltage, direct current to AC power, the simplified illustration of FIG. 1 comprises a system voltage 100 which is to be switched selectively on and off by switching device 102 in order to generate the desired alternating current. The switching device is preferably an IGBT, but it is within the scope of the invention to include any type of device which could interrupt a high current flow wherein a system inductance 104, stray or otherwise, would tend to generate an undesired voltage spike as a result of this fast interruption of the current flow. The invention is even applicable to a safety circuit which could be inserted to inhibit such a voltage spike in the case of a circumstance where an open circuit would occur at the location of the switching device 102.

Figure 6:
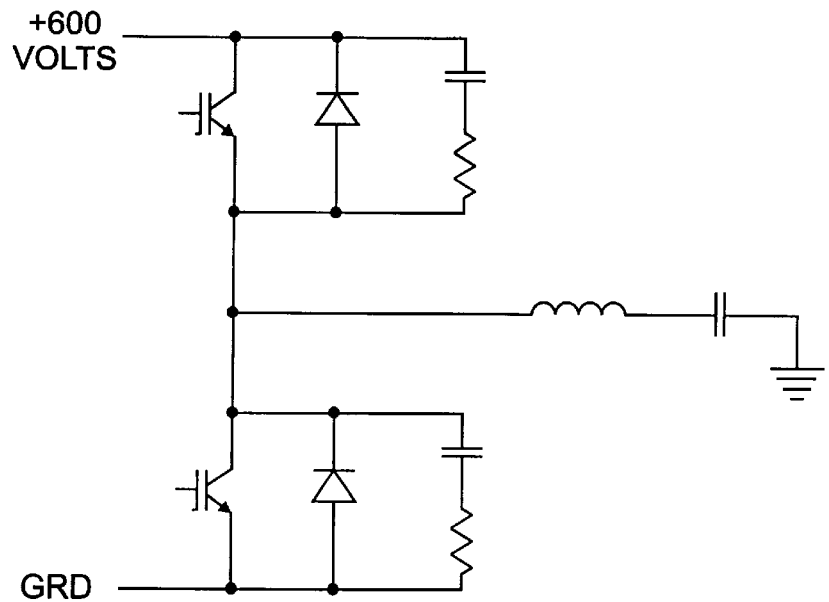
FIG. 6 is a prior art snubber circuit.

With further reference to FIG. 1; parallel to the switching device 102 is a network 106 comprised of a capacitor 108, a transforming device 114 and a resistor 110. In conventional snubber networks (FIG. 6) associated with a switching device, the capacitor would limit the voltage spike generated by the opening of the switch 102 and a resistor 110 serially connected thereto would dampen the ringing of the capacitor voltage. It is a particular feature of the invention that the resistor 110 is inserted into the network 106 via a transforming device 114 having a primary serially connected to the capacitor, and a secondary connected across the resistor 110.

It is a more important feature of the invention that the transformer 114 comprises a saturable core device that is intended to saturate during the operation of the system to effectively disconnect and remove the resistor 110 from the network.

More particularly, at a time of saturation, the core of the transformer, which is constructed of a magnetic material, saturates due to the current flow through its primary, and no longer functions as a transformer. In other words, and for all practical purposes, upon saturation of the core of the transformer 114, it behaves as a low inductance short across resistor 110, hence no power is dissipated in it. Preferably, the transformer 114 comprises a saturable magnetic core material wherein the primary can be an existing part of the circuit, as shown, where it is connected in series with the circuit. The secondary is thus connected to the resistor 110.

In the preferred embodiment, the transformer is a toroidal ferrite core on a mounting bracket (see FIG. 2A) with seven turns of high voltage wire wound around it (the number of turns can, of course, vary upon demand). The seven turns comprise the secondary of the transforming device 114 and are connected across damping resistor 110. The primary is a single conductor 50 passing through the center of the core 122. Such a construction effectively provides a single turn primary with very low inductance. The capacitor 108 is mounted directly to the switching device and presents a very low inductance to the circuit 106.

Figure 2A:
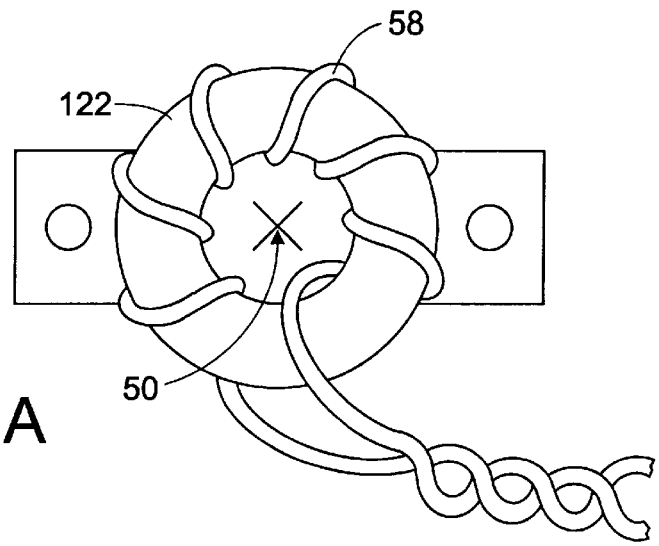
FIGS. 2A and 2B are illustrations of the configuration of a transformer and a mounting bracket therefor as can be implemented by the invention.
Figure 2B:
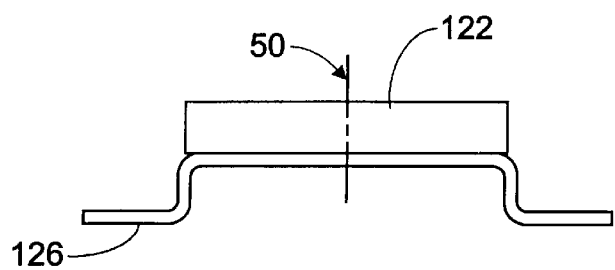

With reference to FIG. 2B, mounting bracket 126 is a stepped bracket to effectively raise the core 122 away from the support to which it is attached, usually a cooling bus (not shown) of some sort, to allow for adequate cooling of the core in view of the temperatures it may reach during operation.

Another advantage of the transforming device 114 is that the effective primary resistance of the circuit is the value of the resistor 110 divided by the square of the turns ratio of the transformer 114. If seven turns were employed, in this case it would be the value of the secondary resistance divided by 49. A consequent benefit of this construction is that the secondary inductance is also divided by the same factor. The resistor value can be selected to give any desired primary resistance while the transformer reduces the insertion inductance by a factor of approximately 49.

The significant advantage of this system is that when the switching device current is initially switched off, the capacitor 108 picks up the current and there is only current in the resistor through the secondary up to the point where the transformer core saturates. It is thus intended in accordance with the method of the invention that core should be designed to saturate quickly at the switching current levels. When saturation does occur, the resistor is thus out of the circuit and the primary of the transformer looks like a very low inductance short circuit to the bypassing current. As the capacitor charges to the full applied voltage, the current in the capacitor 108 and therefor the transformer primary decreases so that the secondary resistor 110 is effectively back in the circuit again. In other words, the saturated core device goes out of saturation so that the resistor can effectively dampen the ringing and oscillations between the capacitor and the inductance 104. Thus, a key advantage of the system is that the saturation of the transformer core has no effect on the ability of the resistor to damp oscillations, or the capacitor to limit voltage spikes, but does result in a significant reduction in the power dissipated in the resistor by effectively taking the resistor out of the circuit for the time period during which the transformer is in saturation. For example, in a common 10 KHZ system, the resistor wattage dissipated is about 173 watts compared to a system where the resistor is merely serially connected to the capacitor and where 1800 watts are dissipated by the resistor—nearly a 90 percent improvement.

Figure 5:
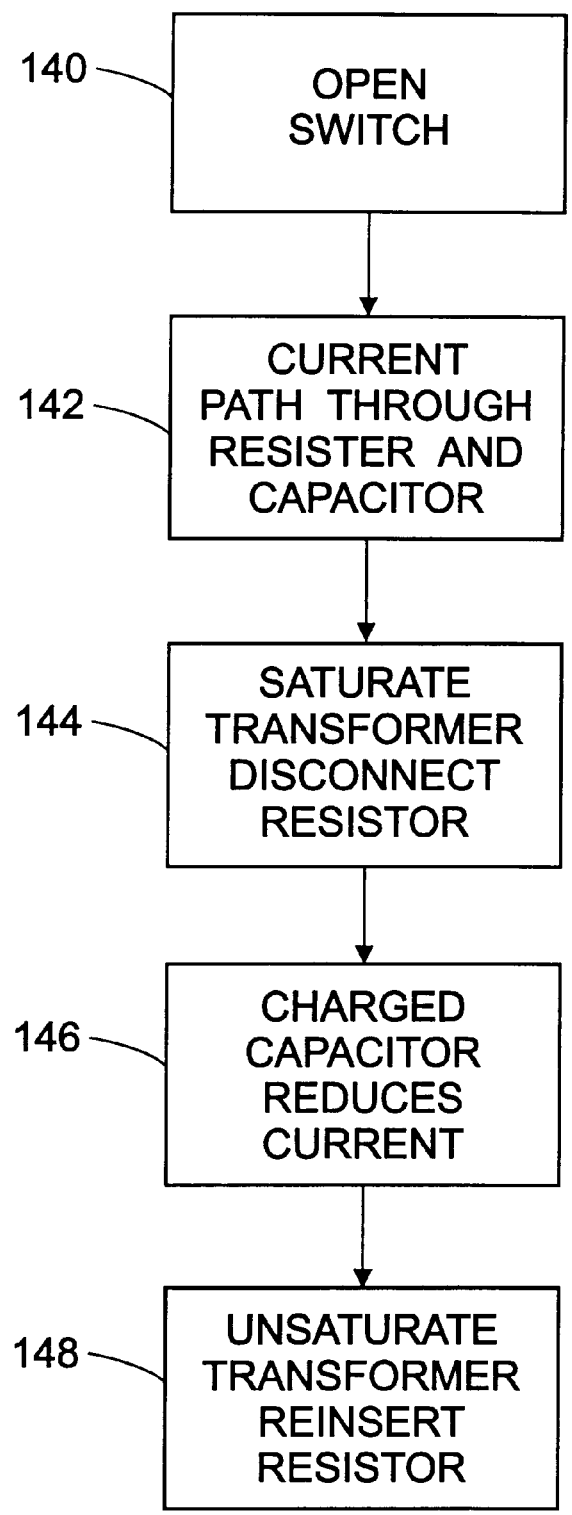
FIG. 5 is a flow chart of a method of the invention.

FIG. 5 comprises a flowchart illustrating the crucial steps in the implementation of the invention. When the switching device 102 is opened at step 140, the system current will bypass a switching device into the network 106 to charge the capacitor 108. The system thus provides a zero voltage switching of the device 102 and thus avoids the undesired voltage spike.

Initially, since the transforming device is not saturated, both the resistor 110 and capacitor 108 will effectively be in the circuit as shown at step 142. However, as will be seen later, the transformer device 114 quickly saturates so that the resistor 110 is only in the circuit for a very short period of time. At saturation, step 144, the resistor 110 is effectively out of the circuit so that the current bypassing the switching device does not dissipate power in the resistor and solely charges up the capacitor 108. As the capacitor becomes fully charged at step 146, the current to the transformer is reduced so that the ferrite core becomes unsaturated and the resistor is reinserted into the system as at step 148.

Figure 3A:
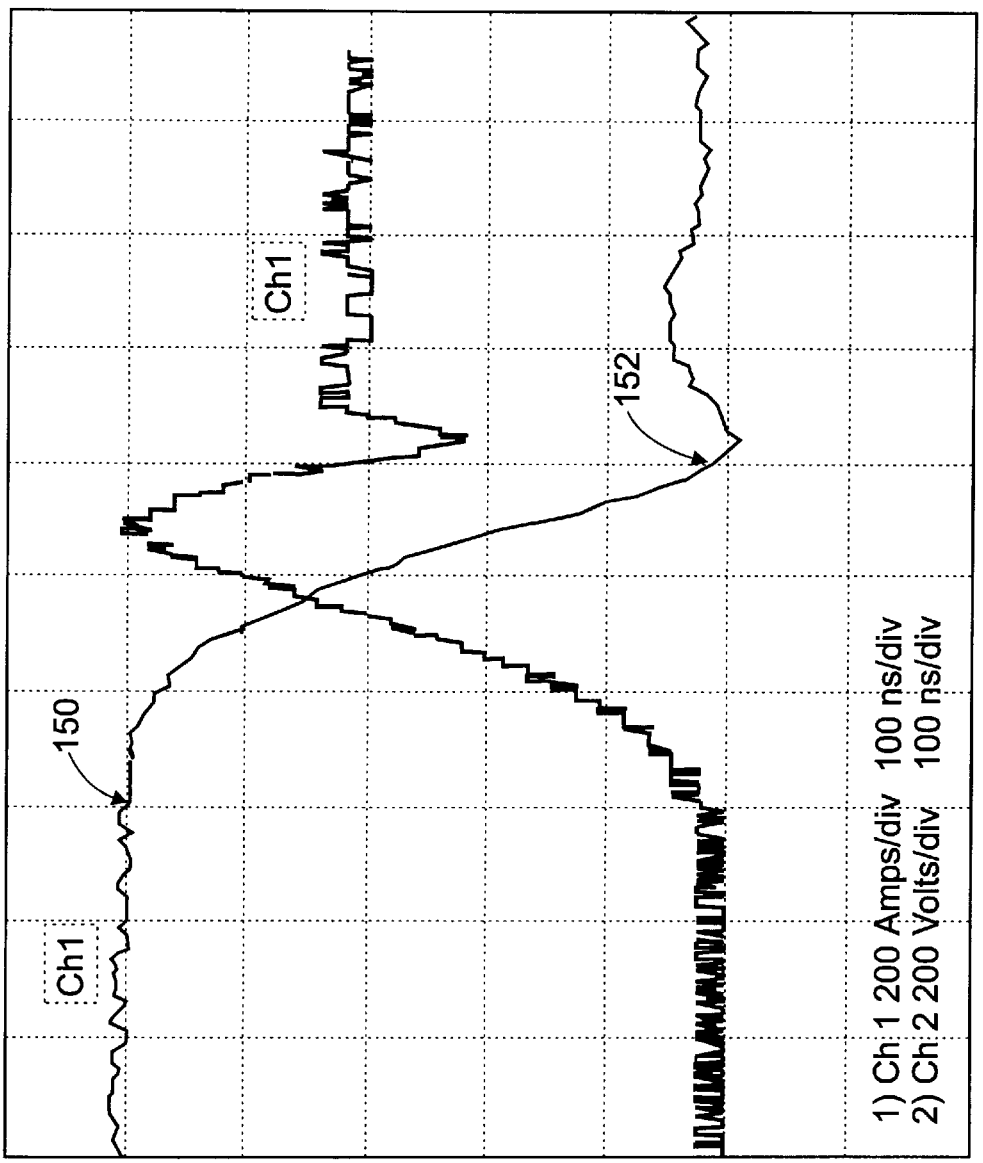
FIGS. 3A, 3B and 3C are graphs showing the collector-emitter voltage of an IGBT formed in accordance with a prior art system and in the switching circuit of the present invention at the time of switching versus time.
Figure 3B:
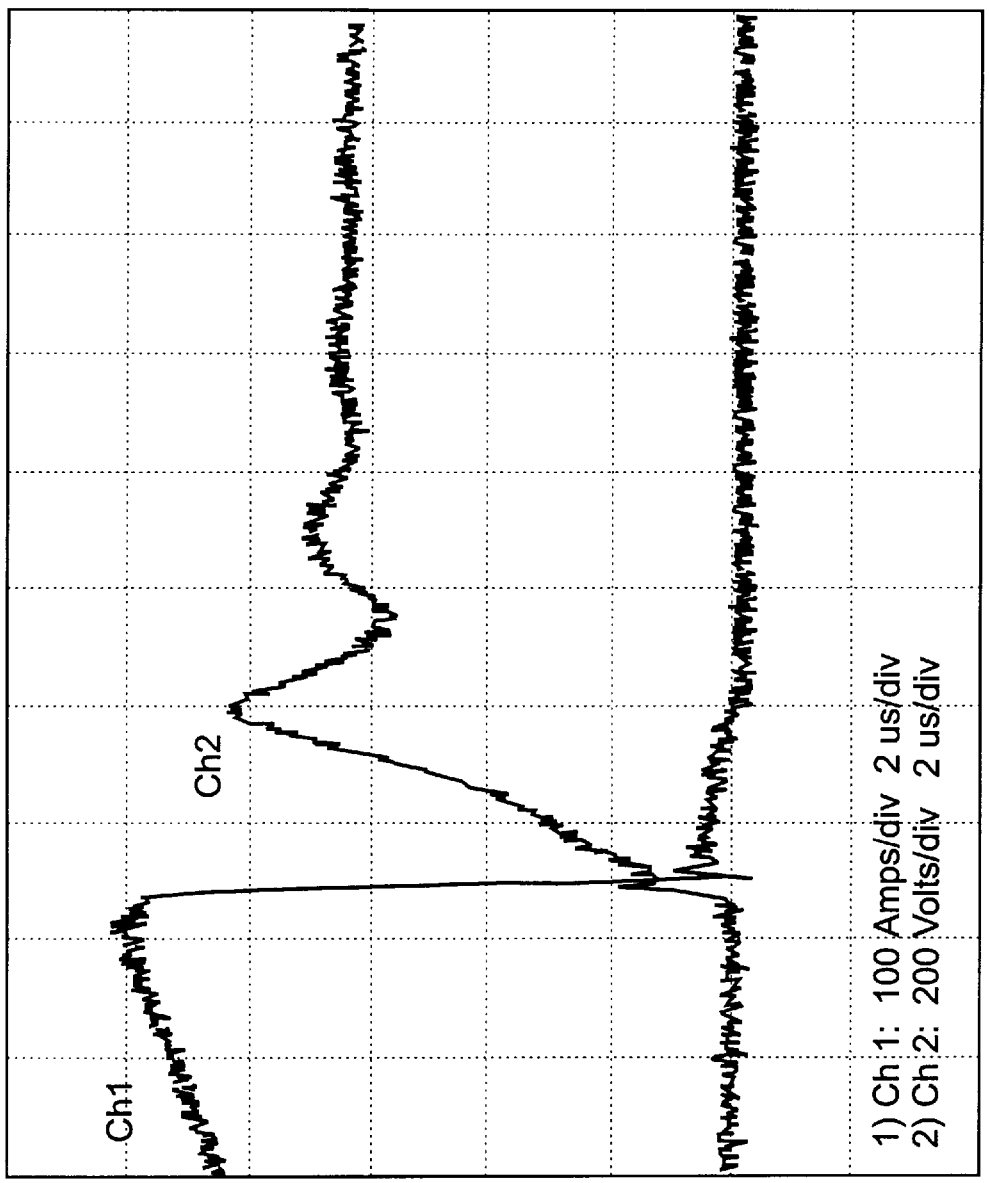
Figure 3C:
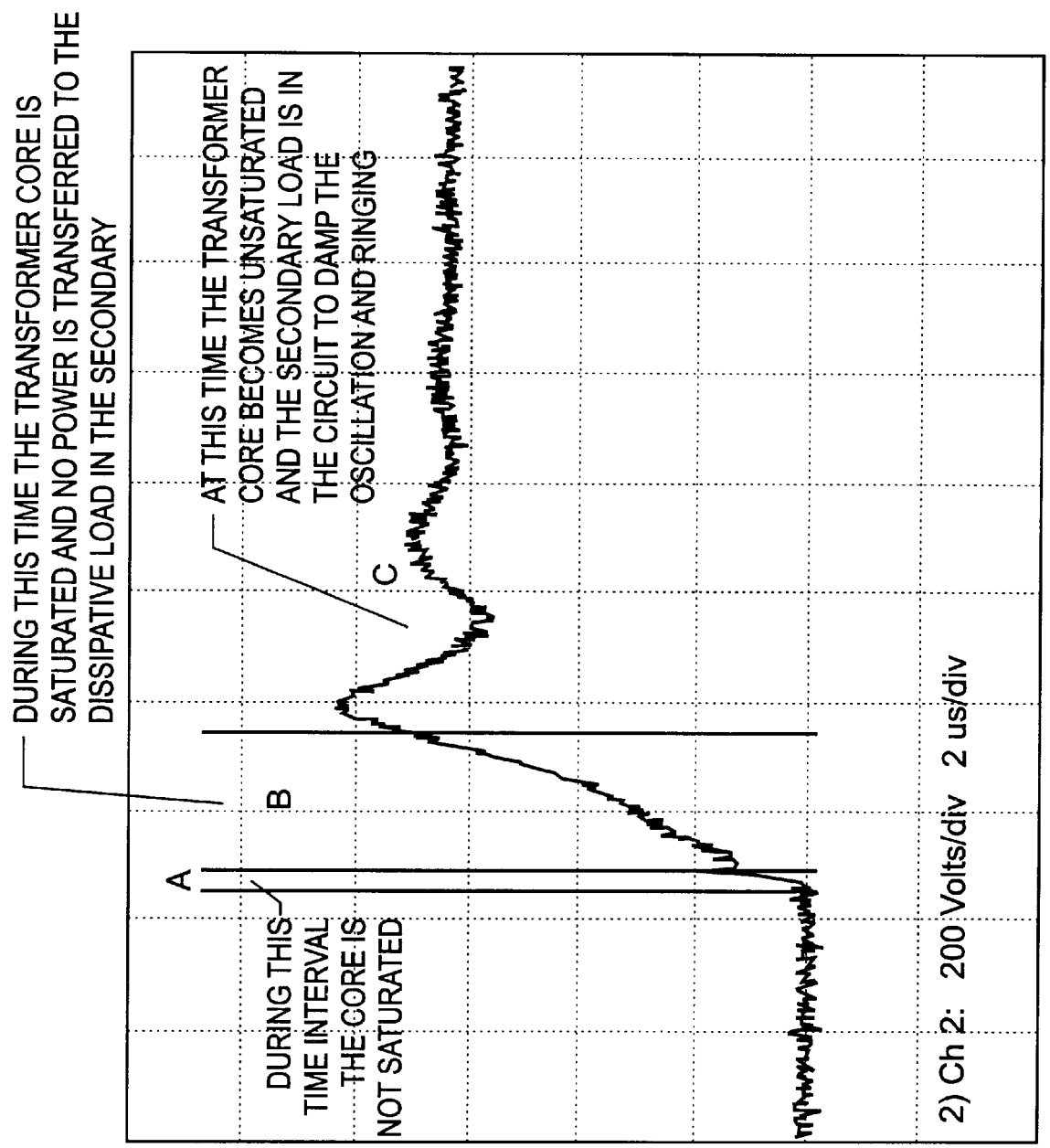

The dramatic improvement in operational advantages is best seen in reference to FIGS. 3A, 3B and 3C. In FIG. 3A, representing the system without the network 106, channel 1 shows the IGBT collector current from the time of turn off shown at 150 until system voltage across the device is effectively reached, at point 152. Channel 2 is the collector-emitter voltage across the switch and it can be seen that the voltage rises to approximately 1000 volts due to the stray circuit inductance. Also, it can be seen that the time interval where both the voltage and current are relatively high is extended so that considerable power is dissipated in the IGBT by the switching action of the device.

FIG. 3B shows comparable wave forms for a system formed in accordance with the present invention. Channel 1 shows the collector current going to zero and channel 2 is the collector-emitter voltage rising at turn off. An important difference to note with reference to FIG. 3A, is that the capacitor voltage rises more slowly and has a lower peak value. It appears that the peak value is in fact no more than 20 percent greater than the system voltage so that the resulting voltage spike due to the switch turn off is much safer than the system represented in FIG. 3A.

Also, the power dissipated by the IGBT in the switching interval is considerably lower than the system of FIG. 3A. These features are shown more clearly in FIG. 3C which shows only the voltage rise on an IGBT in the system including the saturable core transformer of the subject invention. The collector-emitter voltage shown is illustrated with indication of significant events in the method of the invention. The time period A denotes the interval where the transformer core is not saturated and it can be appreciated that this is a very short time relative to overall voltage rise. In period B the transformer core is saturated and no power is transferred to the resistor by the secondary of the transformer. This illustrates the significant reduction in power losses achieved by the subject invention. For a time period C the transformer core becomes unsaturated and the secondary resistive load is in the circuit to damp system oscillations and ringing.

Figure 4:
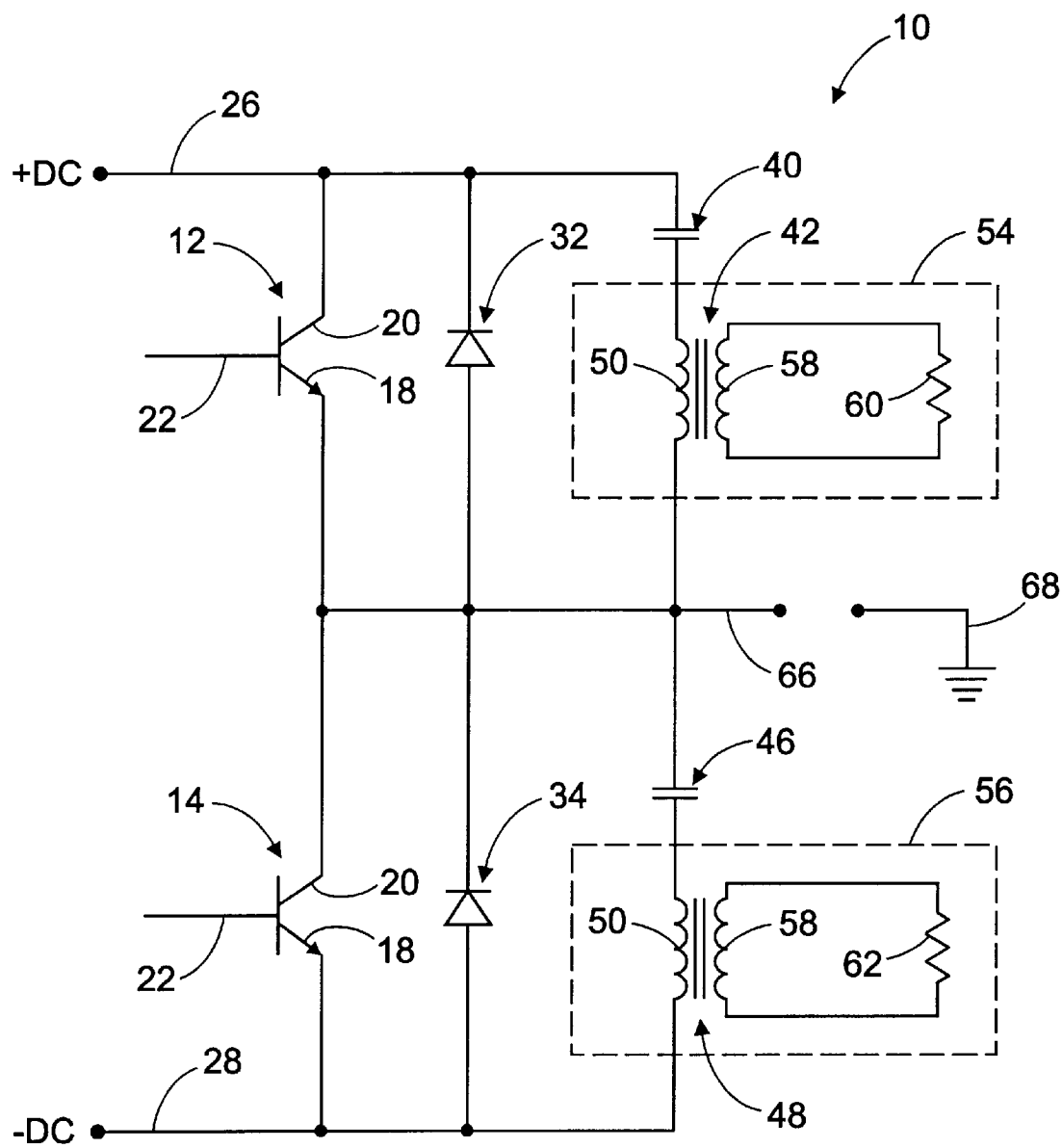
FIG. 4 is a detailed schematic diagram of a circuit formed in accordance with the present invention.

With reference to FIG. 4 a more specific embodiment of an inverter circuit is shown. A high-voltage, high-current DC switching circuit converts DC power to AC power. The switching circuit or inverter 10 includes first and second IGBTs 12, 14 connected in series. Each IGBT has an emitter 18, a collector 20 and a base 22. The emitter 18 of the first IGBT 12 is connected to the collector of the second IGBT 14. The collector of the first IGBT and the emitter of the second IGBT are connected across the positive and negative or source terminals 26, 28, respectively, of a DC input.

A first diode 32 is connected in parallel across the collector 20 and emitter 18 of the first IGBT 12. Analogously, a second diode 34 is connected in parallel across the second IGBT 14. The diodes are connected in a direction anti-parallel to the IGBTS. That is, the diodes are connected to the IGBTs such that the diode current flows in a direction opposite to the IGBT current flow. These diodes function as clamping diodes. When the collector-emitter voltage of the IGBT rises to a certain level, the diode conducts current to reduce the voltage and protect the IGBT from damage.

Connected in parallel to the first diode 32 and first IGBT 12 is a first ZVS capacitor 40 and a first ferrite toroidal transformer 42 which are in series. Analogously, connected in parallel to the second diode 34 and second IGBT 14 is a second ZVS capacitor 46 and a second ferrite toroidal transformer 48 which are in series. The ZVS capacitors supply a load current during a switching interval in the circuit.

More specific to the configuration, each of the ZVS capacitors 40, 46 are connected in series with a primary winding 50 of the transformers 42, 48. The first and second transformers are part of first and second damping circuits 54, 56. The damping circuits 54, 56 minimize oscillations in the switching circuit 10 without consuming much electrical energy.

By way of background, a transformer is an electrical component used to transfer electrical energy from one AC circuit to another by magnetic coupling. In general, a transformer consists of two multi turn coils of wire placed in close proximity to cause the magnetic field of one to link the other. One of the coils serves as the primary winding and the other serves as a secondary winding. When the primary winding is connected to alternating current, it produces an alternating flux in the core. The flux generates a primary electromotive force which is essentially equal and opposite to the voltage supplied to it. It also generates a voltage in the secondary winding. This voltage generated in the secondary winding supplies current to a device connected to the terminals of the secondary winding. The current in the primary winding is regulated to meet the power demand of the load connected to the secondary winding. Thus, in normal operation, current can be transferred from the primary to the secondary electromagnetically. More importantly, the electrical characteristics of an input current can be altered to achieve desired electrical characteristics in an output current. For example, transformers are used to alter the following: voltage magnitude; current magnitude; phase angle; impedance level and voltage insulation level. Ordinarily, transformers are used in inverters to change the voltage and current magnitude between the inverter and a device driven by the inverter. However, in the present invention, the transformers 42, 48 serve another purpose.

With reference to FIG. 2A, the primary winding 50 of the transformer is a copper tube approximately 2.5 cm in diameter. The copper tube introduces very little inductance to the circuit. Each of the secondary windings 58 of the first and second transformers 42, 48 are connected across damping resistors 60, 62, respectively. The secondary windings are copper wire. The damping resistors dampen the oscillations produced when the ZVS capacitors resonate with the bus inductance.

The value of the resistance of the damping resistor 60, 62 reflected back to the primary windings 58 is the resistor value divided by the square of the turns ratio of the transformers. The value of the damping resistors 60, 62 are chosen to give the desired primary resistance. In the preferred embodiment, the transformer has a 7-1 turns ratio. That is, the primary winding consists of 1 turn of copper tube and the secondary winding consists of 7 turns. Between the IGBTs is an output terminal 66 which supplies alternating current to a load (not shown). A ground terminal 68 completes the circuit to the load.

As noted above, an advantage to this configuration is that any secondary inductance is also divided by the square of the turns ratio. Thus, while the resistance is kept to a desired value, the inductance in the primary is minimized.

Further, the watts in the damping resistor are far lower than they would be if the resistor was inserted in series in place of the primary winding. A resistor directly in series with the capacitor would dissipate much power during the charging and discharging of the capacitor as well as during damping of oscillations in the circuit. This waste of energy is unnecessary.

In operation, the switching circuit is supplied with DC power at input terminals 26, 28. The bases 22 of the IGBTs are alternately biased with ±15 V. More specifically, the base of the first IGBT 12 is biased at +15 V to conduct current through the first IGBT. Simultaneously, the base of the second IGBT 14 is biased at −15 V to bar current through the second IGBT. Thus, output terminals 66, 68 show a positive voltage. Then, the biasing voltages to the bases 22 are stopped or set to zero for an increment of time. After that, the polarities on the bases are reversed and the first IGBT is biased with −15 V and the second IGBT is biased with +15 V. Now, the output terminals show a negative voltage. Again, the biasing voltages to the bases are stopped for an increment of time. Then, the process is repeated.

During the switching interval, i.e., during the time that the biasing voltages to the bases are zero, the load current is considered constant. This load current is equal to the value of the current switched out of the IGBT and into the ZVS capacitors. Each capacitor supplies half the load current during this time interval.

In the present embodiment, the transformer saturates when the circuit is energized. This saturation limits the power coupled into the resistor from the capacitor charging and discharging current. When the capacitor is charged up, the transformer desaturates or comes out of saturation. Then, the transformer-resistor combination or damping circuits 54, 56 acts to dampen the oscillations. Because oscillations are minimized, the circuit is more energy efficient.

In the preferred embodiment, the desired value of primary resistance is approximately 400 milliohms. As stated earlier, the resistance of the damping resistor 62 as seen at the primary 50 is a reduction of the actual resistance of the resistor by the square of the turns ratio of the transformer. Accordingly, the damping resistor 62 is selected to be approximately: $7^2 \times 400 \times 10^{-3} = 19.6$ ohms or 20 ohms. The actual inductance of the 20 ohm resistor and associated leads is about 1 microhenry. However, placing the damping resistor into the damping circuit 54, 56 reduces the perceived inductance in the switching circuit to about 20 nanohenries.

With reference to FIG. 1 and FIG. 4, the circuit 10 of the present invention successfully dampens oscillations produced when the capacitors 40, 46 resonate with the circuit inductance. With reference to FIG. 3C, a graph of the collector-emitter voltage Vce on one of the IGBTs 12, 14 versus time shows that the voltage fluctuations are quickly dampened after the IGBT is switched. The graph shows the dampened oscillations of an embodiment in which a cross-sectional area of the core of the damping transformers is 0.575 cm². The following table presents the measurements in the circuit corresponding to the results of the graph of FIG. 3C.

TABLE 1

| Characteristic | Value |
| --- | --- |
| Biasing Frequency | 10 kHz |
| Bus Voltage | 658 V |
| Bus Inductance | 150 nH |
| Damping Resistor | 20 Ohms |
| ZVS Capacitor | .5 µF |
| Output Current | 1000 A |
| Switching Current | 1413 A |
| Cross Sectional Area of Ferrite Core of Transformer | 0.575 cm² |
| Saturation Flux Density of the Core of the Transformer | 4300 Gauss |
| Total AC Capacitor Current at 10 kHz (RMS) | 57 A |
| Capacitor Current (peak) | 353 A |
| Collector-Emitter Voltage of IGBT (peak) | 855 V |
| Resistor Current (peak) | 50.4 A |
| Resistor Voltage (peak) | 1009 V |
| Resistor Current (RMS) | 2.94 A |
| Resistor Power (RMS) | 173 W |

Although the circuit is operative using two of the same IGBTs, diodes, transformers, and damping resistors, it is to be appreciated by one skilled in the art that different values or types of components may be used. Of course, the values or characteristics of the components should be selected to achieve the desired overall characteristics of the circuit and output current.

Further, it is to be appreciated that the IGBT may be replaced with other types of switching devices such as MOSFETs, silicon-controlled rectifiers (SCRs) and the like without departing from the scope of the present invention. In addition, it is to be appreciated that the transformer-resistor or damping circuit of the present invention may be used to dampen other types of circuits.

Figure 7:
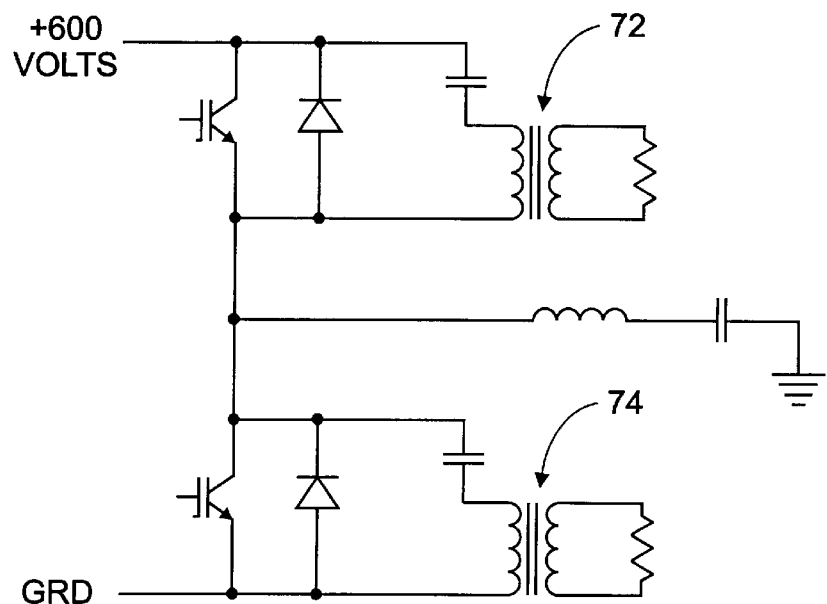
FIGS. 7–9 are schematic embodiments of other inverter circuits including the subject invention.
Figure 8:
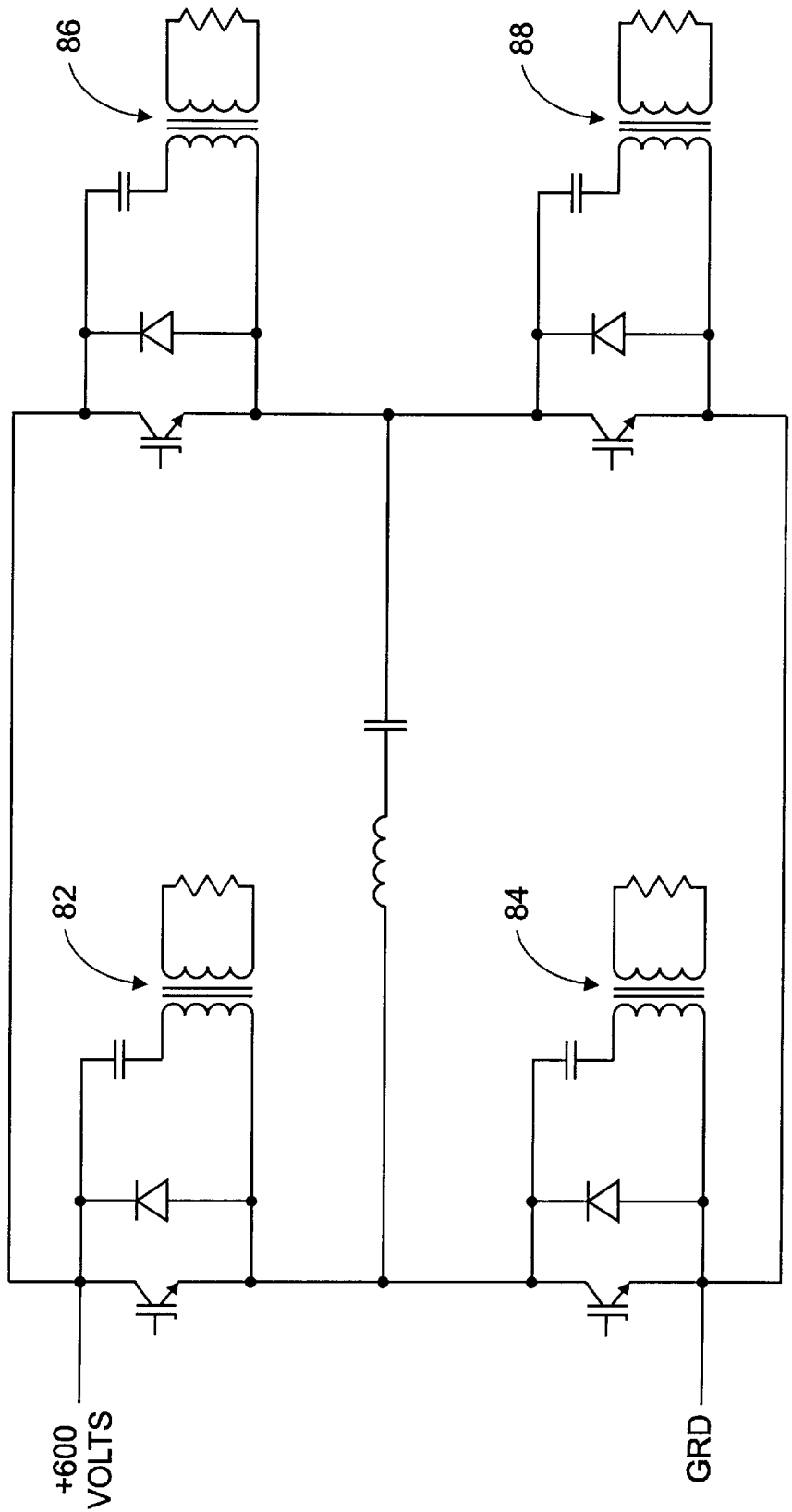
Figure 9:
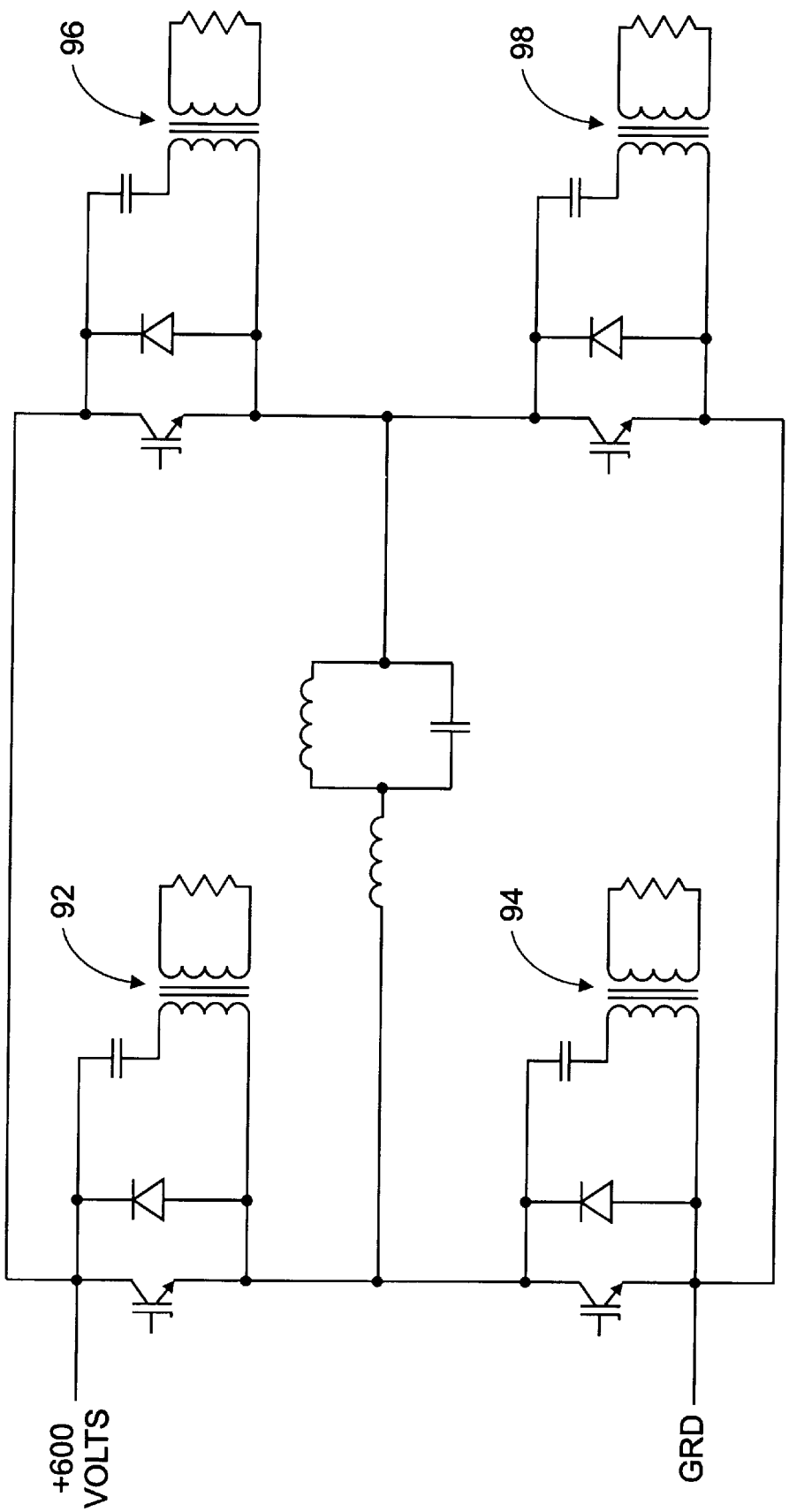

Schematic illustrations of actual practical configurations of inverter circuits are shown in FIGS. 7–9. FIG. 7 shows a half bridge inverter with series load circuit having first 72 and second 74 saturable core devices. FIG. 8 is a full bridge inverter with series load circuit having saturable core devices 82, 84, 86, 88. FIG. 9 is a full bridge inverter with series parallel load circuit having saturable core devices 92, 94, 96, 98.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, we now claim:

1. A method of zero voltage switching a high frequency inverter circuit to obtain significant reduction in power dissipation while limiting voltage spikes and damping oscillations, comprising:

disposing a saturable core transforming device in association with a switch of the inverter, a capacitor, and a power dissipating resistor;

opening the switch while the switch is conducting a current to allow an effective connection of the capacitor across the switch and to provide a path for the current for controlling a voltage across the switch;

saturating the saturable core transforming device wherein the current bypasses the power dissipating resistor; and, reducing the current through the saturable core transforming device by fully charging the capacitor, thereby unsaturating the saturable core transforming device and effectively reinserting the power dissipating resistor in series with said capacitor to dampen oscillations and limit voltage spikes across the switch, whereby power dissipation in the power dissipating resistor is reduced by effectively connecting said resistor only during a time period of each switching cycle when the saturable core transforming device is unsaturated.

2. The method as defined in claim 1 wherein the saturating comprises converting the saturable core transforming device to an effectively low inductance short of the resistor.

3. The method as defined in claim 1 wherein the transforming device has a primary and a secondary, the primary being serially connected to the capacitor and the secondary being connected across the resistor, the method further comprising reducing a reflected inductance to the primary in accordance with a preselected turns ratio between the primary and the secondary.

4. The method as defined in claim 3 wherein the turns ratio of the secondary to the primary is seven to one.

5. The method as defined in claim 1 wherein the saturating occurs during an initial minimal period of a charging of the capacitor.

6. The method as defined in claim 5 wherein a peak voltage reached by the charging of the capacitor is no more than 120 percent of a system voltage.

7. The damping circuit as set forth in claim 1 wherein the first switching device is a power transistor.

8. The damping circuit as set forth in claim 1 wherein the first switching device is one or more of an IGBT, MOSFET, and SCR.

9. A method of zero voltage switching a high frequency inverter circuit to obtain significant reduction in power dissipation while limiting voltage spikes and damping oscillations, comprising:

disposing a saturable core transforming device in association with a switch of the inverter, a capacitor, and a power dissipating resistor;

opening the switch conducting a current wherein a voltage spike is tended to be produced by the interruption of said current in the circuit inductance;

saturating the saturable core transforming device for allowing the effective connection of the capacitor across the switch, bypassing the power dissipating resistor to provide a path for said current and thereby controlling the voltage across the switch, reducing the current through the saturable core transforming device by fully charging the capacitor, thereby unsaturating the saturable core transforming device and effectively inserting the power dissipating resistor in series with said capacitor to dampen oscillations across the switch, reducing power dissipation in the power dissipating resistor by effectively connecting said resistor only during the time period of each switching cycle when the saturable core transforming device is unsaturated.

10. A method of effecting a safe switching in a switching circuit at an opening of a switch, wherein a parallel network to the switch includes a capacitance and a resistance to preclude an undesired energy spike tended to be induced across the switch at the opening, comprising steps of:

disposing in the parallel network a saturable core device having a primary serially connected to the capacitance and a secondary connected across the resistance;

at the opening of the switch, transferring the switched current to the capacitance through the primary and dampening oscillations of said current by the secondary to primary reflected resistance;

prior to a charging up of the capacitor, saturating the saturable core device for effectively eliminating the resistance from a path of the switched current; and, upon a reducing of the switched current wherein the satuable core device becomes unsaturated, effectively reinserting the resistance to the path for continued damping of said current.

11. A method of safely precluding an undesired voltage spike across an open circuit, tended to be induced by a fast interruption of current through an inductance of the circuit, comprising steps of:

disposing a parallel network to the open circuit wherein a resistance of the network is selectively disconnectable for minimizing power dissipation through the resistance for times when a capacitance of the network is better suited for solely picking up the interrupted current;

transferring the interrupted current through the network; and, before a fully charging up of the capacitor, effectively disconnecting the resistance from the network with a saturable core device wherein upon a saturating of the device, additional dissipating of power by the resistance is precluded.

12. The method as defined in claim 11 further comprising disposing the parallel network as a snubber circuit for a solid state switch.

13. The method as defined in claim 11 wherein the saturable core device comprises a transformer and the saturating comprises exceeding a predetermined magnetic flux density of the transformer.

14. The method as defined in claim 13 wherein the transformer has a preselected primary to secondary turns ratio, the capacitance being disposed on the primary and the resistance being disposed on the secondary, wherein the secondary circuit inductance reflected to the primary is greatly reduced.

15. The method as defined in claim 11 wherein the dissipating includes damping a ringing or oscillation of the network.

16. A power inverter for changing direct current provided at a pair of source terminals into alternating current provided at a pair of load terminals comprising:

a first transistor having a base, a collector and an emitter, the collector and the emitter conducting current from the one of the source terminals to one of the output terminals;

a first transformer having a magnetic core, a primary winding and a secondary winding, a first end of the primary winding connected to one of the collector and the emitter;

a first source of capacitance connected between a second end of the primary winding and the other of the collector and the emitter; and, a first resistor for damping oscillations occurring in the circuit when the first transistor is switched, the resistor connected between a first and a second end of the secondary winding of the first transformer.

17. The inverter as set forth in claim 16 further including:

a second transistor having a base, a collector and an emitter, the collector and the emitter conducting current from the other of the source terminals to the one of the output terminals;

a second transformer having a magnetic core, a primary winding and a secondary winding, a first end of the primary winding connected to one of the collector and the emitter of the second transistor;

a second source of capacitance connected between a second end of the primary winding of the second transformer and the other of the collector and the emitter of the second transistor; and, a second resistor for damping oscillations occurring in the circuit when one or more of the first and second transistors is switched, the resistor connected between a first and a second end of the secondary winding of the second transformer.

18. The inverter as set forth in claim 16 wherein the source of capacitance is a capacitor.

19. The inverter as set forth in claim 18 wherein the capacitor is a zero-voltage-switching capacitor.

20. The inverter as set forth in claim 16 further including:

a clamping diode connected anti-parallel to the collector and the emitter of the first transistor.

21. The inverter as set forth in claim 16 wherein the number of turns of the secondary winding is greater than the number turns of the primary winding.

22. The inverter as set forth in claim 21 wherein the number of turns of the primary winding is 1.

23. The damping circuit as set forth in claim 16 wherein the first switching device is a power transistor.

24. The damping circuit as set forth in claim 16 wherein the first switching device is one or more of an IGBT, MOSFET, and SCR.

25. A switching circuit for altering input current provided at a pair of source terminals into output current provided at a pair of load terminals, a switching device of the switching circuit causing unwanted voltage spikes across a first node and a second node of the circuit, the switching circuit comprising:

a first switching device having a base, a collector and an emitter, the collector and the emitter conducting current from the one of the source terminals to one of the output terminals, the first switching device causing voltage spikes in the circuit when switched;

a first transformer having a magnetic core, a primary winding and a secondary winding, a first end of the primary winding connected to one of the collector and the emitter;

a first source of capacitance connected between a second end of the primary winding and the other of the collector and the emitter; and, a first resistor connected between a first and a second end of the secondary winding of the first transformer whereby said resistor dampens the unwanted voltage spikes.

26. The circuit as set forth in claim 25 further including:

a second switching device having a base, a collector and an emitter, the collector and the emitter conducting current from the other of the source terminals to the one of the output terminals;

a second transformer having a magnetic core, a primary winding and a secondary winding, a first end of the primary winding connected to one of the collector and the emitter of the second switching device;

a second source of capacitance connected between a second end of the primary winding of the second transformer and the other of the collector and the emitter of the second switching device; and, a second resistor connected between a first and a second end of the secondary winding of the second transformer whereby the oscillations occurring in the circuit when one or more of the first and second switching devices are switched are dampened.

27. The circuit as set forth in claim 25 wherein the source of capacitance is a capacitor.

28. The circuit as set forth in claim 27 wherein the capacitor is a zero-voltage-switching capacitor.

29. The circuit as set forth in claim 25 further including:

a clamping diode connected anti-parallel to the collector and the emitter of the first transistor.

30. The damping circuit as set forth in claim 25 wherein the number of turns of the secondary winding is greater than the number turns of the primary winding.

31. The damping circuit as set forth in claim 30 wherein the number of turns of the primary winding is 1.

32. The damping circuit as set forth in claim 25 wherein the first switching device is a power transistor.

33. The damping circuit as set forth in claim 25 wherein the first switching device is one or more of an IGBT, MOSFET, and SCR.

34. A damping circuit for protecting an electrical device against voltage fluctuations, the electrical device having a first node and a second node across which the voltage fluctuations occur, the damping circuit consisting essentially of:

a damping transformer having a magnetic core, a primary winding and a secondary winding, a first end of the primary winding connected to the first node and a second end of the primary winding connected to the second node;

a damping resistor for damping the voltage fluctuations, the damping resistor connected across a first end and a second end of the secondary winding.

35. The damping circuit as set forth in claim 34 wherein the number of turns of the secondary winding is greater than the number turns of the primary winding.

36. The damping circuit as set forth in claim 35 wherein the number of turns of the primary winding is 1.

37. A method of zero voltage switching a high frequency inverter circuit to obtain significant reduction in power dissipation while limiting voltage spikes and damping oscillations, comprising:

disposing a saturable core transforming device having a primary and a secondary and a relative turns ratio therebetween, in association with a switch of the inverter, a capacitor, and a power dissipating impedance;

opening the switch while the switch is conducting a current to allow an effective connection of the capacitor across the switch and to provide a path for the current for controlling a voltage across the switch;

saturating the saturable core transforming device wherein the current bypasses the power dissipating impedance;

reducing the current through the saturable core transforming device by fully charging the capacitor, thereby unsaturating the saturable core transforming device and effectively reinserting the power dissipating impedance in series with said capacitor to dampen oscillations and limit voltage spikes across the switch, whereby an inductance of the power dissipating impedance is reflected from the secondary to the primary of the transforming device at a value of the inductance divided by the square of the turns ratio for a reduced inductance to the primary.

38. The method of claim 37 wherein the turns ratio of the secondary to the primary is seven to one.

\* \* \* \* \*